United States Patent [19]
Watatani

[11] Patent Number: 5,905,298
[45] Date of Patent: May 18, 1999

[54] SEMICONDUCTOR DEVICE HAVING AN INSULATION FILM OF LOW PERMITTIVITY AND A FABRICATION PROCESS THEREOF

[75] Inventor: Hirofumi Watatani, Kawasaki, Japan

[73] Assignee: Fujitsu Limited, Kanagawa, Japan

[21] Appl. No.: 08/865,165

[22] Filed: May 29, 1997

[30] Foreign Application Priority Data

Oct. 3, 1996 [JP] Japan ................................. 8-263396
Apr. 15, 1997 [JP] Japan ................................. 9-97672

[51] Int. Cl.⁶ ................................................. H01L 23/58
[52] U.S. Cl. .................... 257/635; 257/295; 257/310; 257/410; 257/637
[58] Field of Search .................. 257/295, 310, 257/410, 635, 637

[56] References Cited

U.S. PATENT DOCUMENTS 5,457,073  10/1995  Ouellet ..................................... 437/231
5,607,773  3/1997   Ahlburn et al. ........................ 428/427
5,719,416  2/1998   Yoshimori et al. ..................... 257/295

FOREIGN PATENT DOCUMENTS 59-72745   4/1984   Japan ..................................... 257/637
1-287930   11/1989  Japan ..................................... 257/635
2-89346    3/1990   Japan .
7-321199   12/1995  Japan .

Primary Examiner—Valencia Martin-Wallace
Attorney, Agent, or Firm—Armstrong, Westerman, Hattori, McLeland & Naughton

[57] ABSTRACT

An insulation structure is formed in a high-density plasma environment by depositing a first $SiO_2$ film containing a substantial amount of F without a substrate bias, followed by depositing a second $SiO_2$ film containing a reduced amount of F with a substantial substrate bias, and further followed by depositing a third $SiO_2$ film containing a substantial amount of F without a substrate bias.

8 Claims, 11 Drawing Sheets

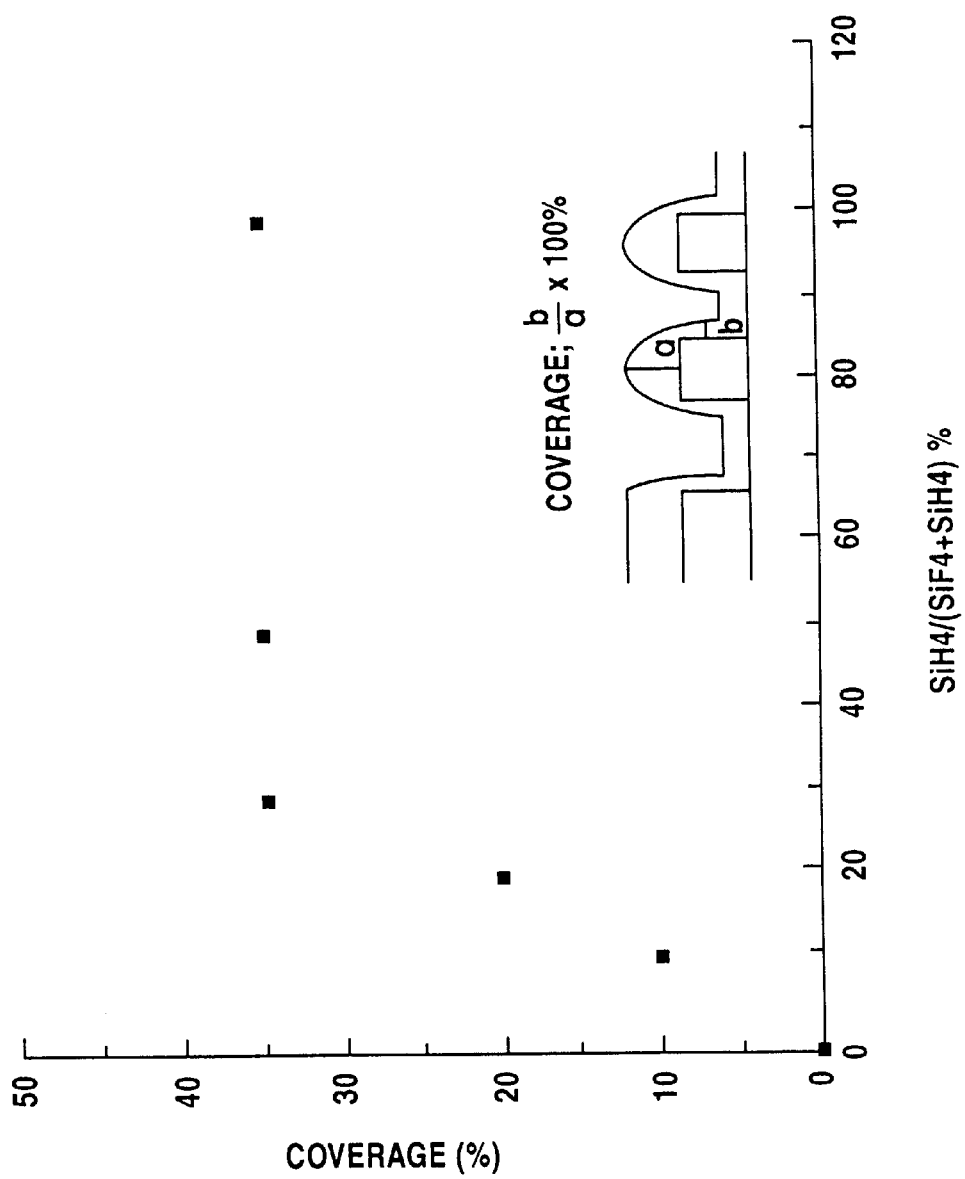

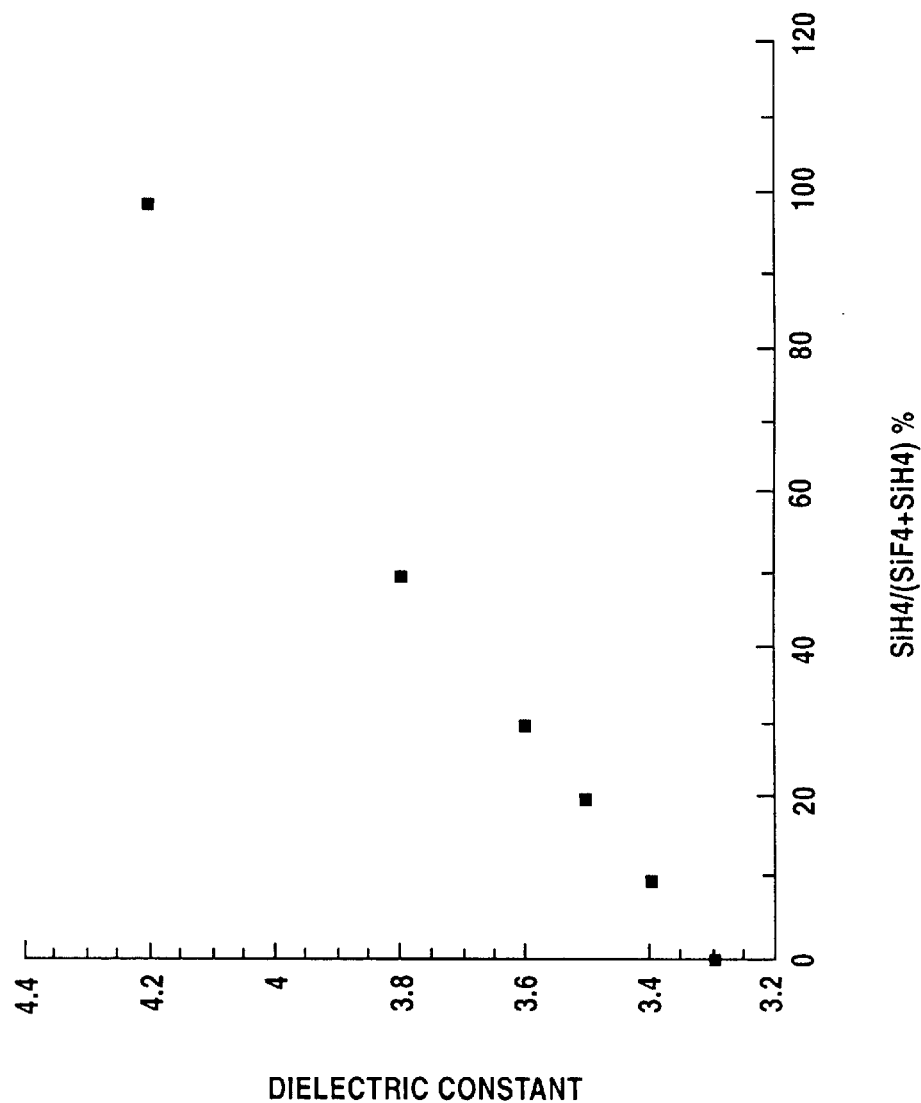

SEMICONDUCTOR DEVICE HAVING AN INSULATION FILM OF LOW PERMITTIVITY AND A FABRICATION PROCESS THEREOF

BACKGROUND OF THE INVENTION

The present invention generally relates to semiconductor devices and more particularly to a fabrication of a semiconductor device and a semiconductor integrated circuit device that has an interlayer insulation film of low permittivity.

In a semiconductor integrated circuit in which a number of semiconductor devices are integrated monolithically, each of the semiconductor devices are covered by an interlayer insulation film. In the art of semiconductor integrated circuit, it is commonly practiced to provide an interconnection pattern further on such an interlayer insulation film to form a multilayer interconnection structure. In recent miniaturized semiconductor integrated circuits, such interconnection patterns are also miniaturized. In relation to this, there emerges a problem in that the electric signals experience a delay due to the permittivity of the interlayer insulation film.

FIGS. 1A–1C show a conventional process for forming a multilayer interconnection structure.

Referring to FIG. 1A, an $SiO_2$ film 13 is formed on a substrate 11 by an ordinary plasma CVD apparatus of the parallel-plate type, such that the $SiO_2$ film 13 covers an interconnection pattern 12 formed on the substrate 11. The $SiO_2$ film 13 thus formed, while having an advantageous feature of low leakage current, generally suffers from the problem of poor step coverage. Thus, it is practiced to deposit another $SiO_2$ film 14 on the structure of FIG. 1A under a high-density plasma environment while applying a substrate bias, as indicated in FIG. 1B. As the $SiO_2$ film 14 is deposited under existence of the substrate bias, the $SiO_2$ film 14 experiences a sputter etching simultaneously to the deposition by the high-density plasma formed in a reaction chamber. As a result of such a sputter etching that competes with the deposition, the $SiO_2$ film 14 shows an excellent step coverage.

After the $SiO_2$ film 14 is thus formed, a chemical mechanical polishing process (CMP) is applied to the $SiO_2$ film 14 for a planarization thereof as indicated in FIG. 1C.

In the planarized structure thus obtained, however, there arises a problem that the operational speed of the semiconductor device does not increase as is expected from the miniaturization, due to the fact that the interlayer insulation film 13 or 14 has a relatively large permittivity, as noted already.

Meanwhile, it is known that the permittivity can be reduced in an insulation film including therein an Si—O bond such as $SiO_2$, by introducing F (fluorine) into the insulation film. The interlayer insulation film 13 or 14 also shows a reduced permittivity with increasing F content in the film. Thus, there is a prospect that a maximization is possible for the operational speed of the semiconductor device by introducing F atoms into the insulation film.

However, conventional attempts to incorporate F atoms into the interlayer insulation film, conducted in a conventional parallel-plate type plasma CVD apparatus, although have been successful at reducing the initial permittivity, have failed due to the problem of unwanted increase of hygroscopicity. As a result of increased hygroscopicity, the permittivity of the interlayer insulation film increases with time, and the desired effect of the decrease of the initial permittivity is canceled out ultimately. Further, the interlayer insulation film, after absorbing moisture in the air, has a poor film quality, and various problems such as corrosion or peeling of the interconnection pattern are caused.

While using a conventional parallel-plate type CVD apparatus, it has not been possible to incorporate a sufficient amount of F atoms into the interlayer insulation film while simultaneously maintaining high film quality. Thus, the permittivity of the film could not be reduced below about 3.8.

On the other hand, it is possible to improve the quality of the interlayer insulation film to a certain extent by using a high-density plasma formed by a induction coupling process (ICP) or electron cyclotron resonance (ECR). However, even such an interlayer insulation film formed under the high-density plasma environment shows an increased hygroscopicity when the F content in the insulation film is increased, and the permittivity cannot be reduced below about 3.5. For example, the interlayer insulation film 13 or 14 formed by the process of FIGS. 1A–1C shows a poor film quality due to the hygroscopicity even when the film formation is made under a high-density plasma condition.

Further, such an interlayer insulation film doped with F tends to cause a problem of corrosion when formed directly on a metal pattern such as an Al interconnection pattern. Further, one encounters a problem, when covering a line-and-space pattern by such an interlayer insulation film, such that the part of the interlayer insulation film filling a gap between adjacent line patterns is decomposed by the action of excessive F in the interlayer insulation film. When this occurs, the step coverage of the line-and-space pattern by the interlayer insulation film is deteriorated substantially.

Meanwhile, it is known conventionally that the permittivity of an interlayer insulation film can be reduced to 2.0–3.0 by using a spin-coated SOG (spin-on-glass) for the interlayer insulation film. However, such an SOG film tends to create a tensile stress field on the substrate surface, and the tensile stress field thus created tends to induce a warp in the substrate such that the substrate surface forms a concaved surface. When such a warp is formed, there occurs various problems such as distortion or displacement of various patterns to be formed on the interlayer insulation film during the photolithographic patterning process.

In order to eliminate this problem, it has been practiced to provide a cap layer of F-doped $SiO_2$ on the interlayer insulation film by using a parallel-plate plasma CVD process or a high-density plasma CVD process. However, the permittivity that can be achieved for such a cap layer by the parallel-plate plasma CVD process is about 3.8 at best. Further, the attempt for further reduction of the permittivity tends to cause the problem of unwanted degradation of the hygroscopicity of the film. Even when the high-density plasma CVD process is used, the permittivity of the obtained cap layer cannot be reduced below about 3.5.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a fabrication process of a semiconductor device including an insulation film such that the insulation film has a low permittivity and simultaneously shows little hygroscopicity.

Another object of the present invention is to provide a process of incorporating fluorine atoms into an insulation film without increasing a hygroscopicity thereof.

Another object of the present invention is to provide a semiconductor device having an interlayer insulation film structure capable of reducing the permittivity and simultaneously reducing the hygroscopicity.

Another object of the present invention is to provide a semiconductor device having a F-doped insulation film of low permittivity and a fabrication process thereof, in which the insulation film has an improved step coverage and simultaneously a minimized hygroscopicity.

Another object of the present invention is to provide a semiconductor device having an insulation cap layer that forms a compressive stress field and a fabrication process thereof, in which the cap layer has a minimized permittivity and simultaneously a minimized hygroscopicity.

Another object of the present invention is to provide a method of fabricating a semiconductor device including a deposition step for depositing an insulation layer on a substrate, said deposition step comprising:

a first plasma CVD step for forming a first insulation film containing fluorine on said substrate in a high-density plasma as a result of a decomposition of a source gas, in a state in which no substantial substrate bias is applied to said substrate;

a second plasma CVD step for forming a second insulation film containing fluorine on said substrate in a high-density plasma as a result of a decomposition of a source gas, in a state in which a substrate bias is applied to said substrate; and a third plasma CVD step for forming a third insulation film containing fluorine on said substrate in a high-density plasma as a result of a decomposition of a source gas, in a state in which no substantial substrate bias is applied to said substrate.

Another object of the present invention is to provide a semiconductor device, comprising:

a substrate, a structure formed on said substrate, said structure including a projection and a depression; and an insulation film provided so as to bury said structure;

said insulation film comprising:

a first insulation film extending in conformity with a cross-sectional shape of said structure;

a second insulation film provided on said first insulation film so as to fill said depression, said second insulation film having a substantially planarized surface; and a third insulation film provided on said second insulation film;

said first insulation film containing an inert gas with a first concentration;

said second insulation film containing said inert gas with a second, higher concentration;

said third insulation film containing said inert gas with a third concentration lower than said second concentration.

According to the present invention, it is possible to minimize the permittivity effective on the interconnection pattern, by depositing the first insulation film under a high-density plasma environment while incorporating therein F atoms with high concentration. By conducting the deposition of the first insulation film under no substantial substrate bias, the first insulation film shows very small hygroscopicity. Further, by depositing the second insulation film further on the first insulation film with a substantial substrate bias but without incorporation of a substantial amount of fluorine atoms, an excellent step coverage is guaranteed and the second insulation film thus deposited shows an excellent planarized surface due to the substrate bias applied at the time of deposition of the second insulation film. As the second insulation film contains few F atoms, no substantial problem of hygroscopicity arises in the second insulation film even when the deposition is made under existence of a substantial substrate bias. The third insulation film covers the planarized surface of the second insulation film with low permittivity and with very low hygroscopicity.

Another object of the present invention is to provide a method of fabricating a semiconductor device including a deposition process of an insulation film on a substrate, said deposition process comprising the steps of:

depositing a first insulation film on said substrate in a high-density plasma as a result of a decomposition of a first gaseous source containing fluorine and hydrogen under a state in which a substrate bias is applied, said first insulation film containing fluorine; and depositing a second insulation film on said substrate in a high-density plasma as a result of a decomposition of a second gaseous source containing fluorine but substantially free from hydrogen, under a state in which a substrate bias is applied, said second insulation film containing fluorine.

Another object of the present invention is to provide a semiconductor device, comprising:

a substrate;

a pattern provided on said substrate; and an interlayer insulation film provided on said substrate so as to bury said pattern;

said interlayer insulation film comprising a first film burying said pattern and a second film provided on said first film;

each of said first and second films being formed of $SiO_2$ doped with fluorine; and said first film further containing hydrogen with a concentration level higher than in said second film.

According to the present invention, the excessive F or its radicals that otherwise would cause a decomposition of the deposited interlayer insulation film are effectively eliminated as a result of the reaction with H. As a result, it is possible to form an interlayer insulation film of low permittivity with an excellent step coverage of a line-and-space pattern on the substrate.

Another object of the present invention is to provide a method of fabricating a semiconductor device including a deposition process of an insulation film on a substrate, said deposition process comprising the steps of:

forming a spin-on-glass layer on said substrate so as to bury a pattern formed on said substrate; and depositing an insulation film of $SiO_2$ doped with fluorine on said spin-on-glass layer by a high-density plasma CVD process.

Another object of the present invention is to provide a semiconductor device, comprising:

a substrate;

a pattern formed on said substrate; and an interlayer insulation film provided on said substrate so as to bury said pattern;

said interlayer insulation film comprising:

a first film of a spin-on-glass provided on said substrate so as to bury said pattern, said first film having a planarized surface; and a second film of $SiO_2$ doped with fluorine and provided on said first film, said second film containing an inert gas.

According to the present invention, it is possible to obtain an interlayer insulation film of very low permittivity as a result of use of SOG. Further, the stress field created by the SOG layer is effectively compensated for by the second insulation film deposited thereon, and the problem of warp of the semiconductor wafer is minimized.

Other objects and further features of the present invention will become apparent from the following detailed description when read in conjunction with the attached drawings.

BRIEF DESCRIPTION OF THE PREFERRED EMBODIMENTS

FIG. 4 is another diagram showing the principle of the present invention;

FIG. 5 is a further diagram showing the principle of the present invention;

DETAILED DESCRIPTION OF THE PREFERRED EMBODIMENTS

[Principle]

Figure 1A:
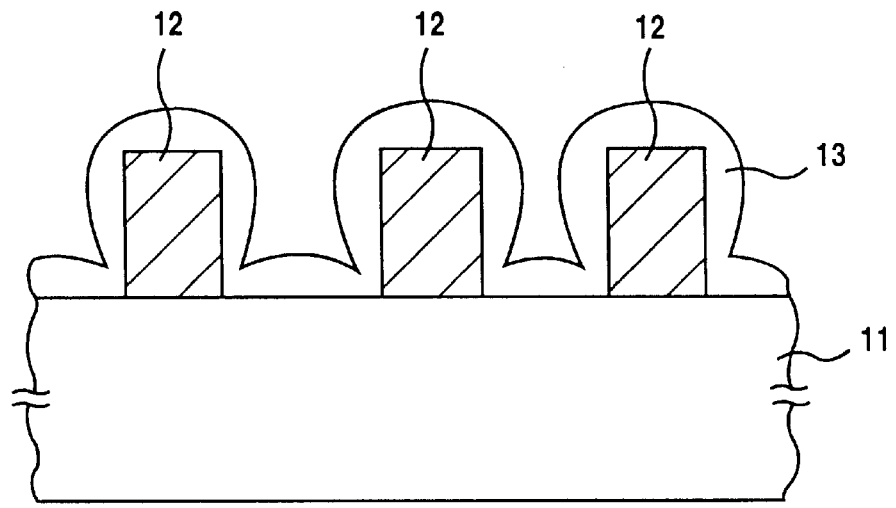
FIGS. 1A–1C are diagrams showing a conventional fabrication process of a semiconductor device.
Figure 1B:
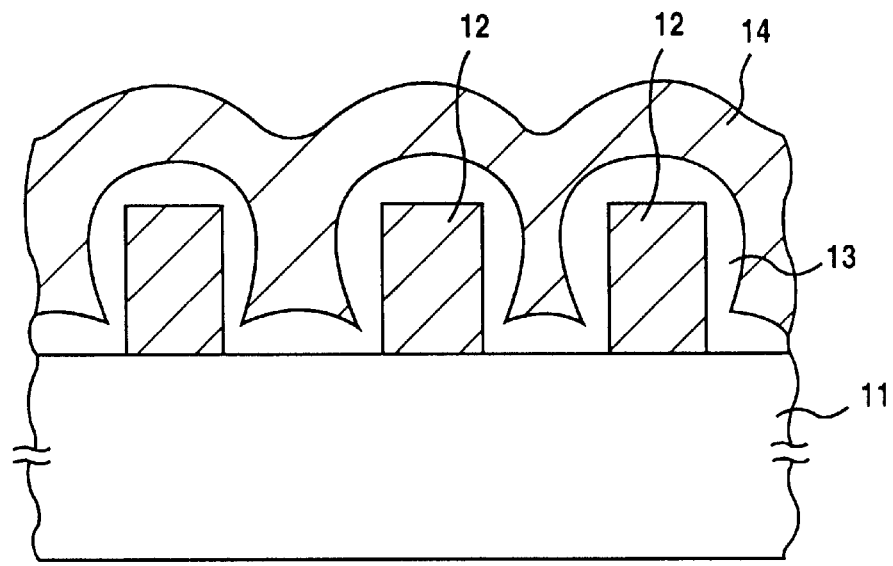
Figure 1C:
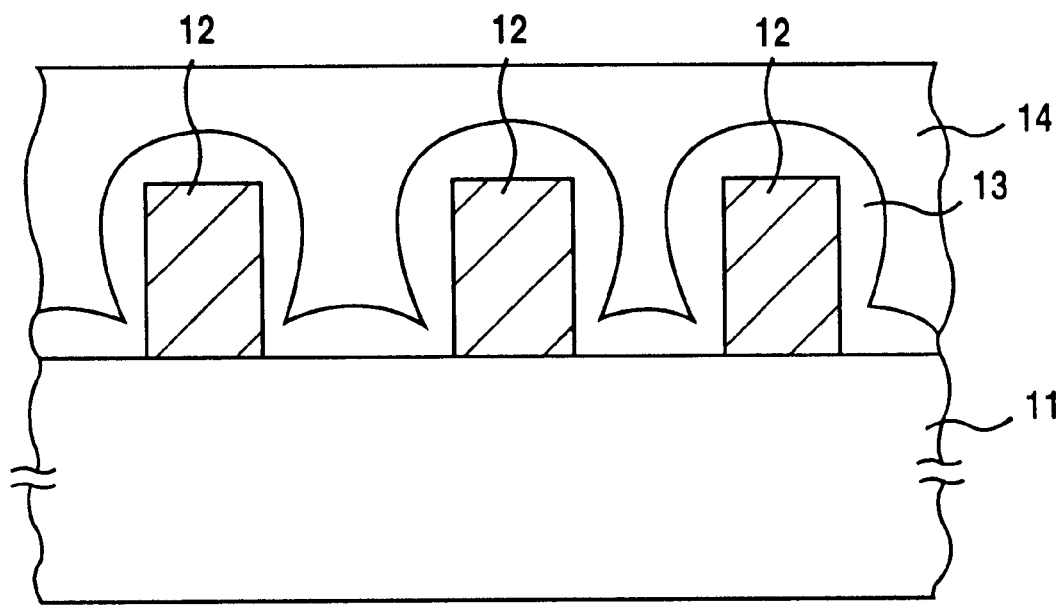

First, the principle of the present invention will be explained with reference to FIGS. 2 and 3.

The inventor of the present invention conducted a series of experiments to deposit a F-containing $SiO_2$ film under a high-density plasma environment. The experiments were conducted in a reaction chamber 10 of an ICP-type plasma CVD apparatus shown in FIG. 2, wherein a high-density Ar plasma is formed in the reaction chamber 10, and the deposition is made by supplying $SiH_4$, $SiF_4$ and $O_2$ into the reaction chamber 10 as respective source gases.

As a result of a decomposition of the source gases, a deposition of a F-containing $SiO_2$ film occurs on a Si substrate 3 held on a stage 1 by means of an electrostatic chuck mechanism 2, wherein the deposition is made while applying a high frequency bias of 13.56 MHz to the substrate 1 from a first RF source (high-frequency power source) 4. Further, the ICP-type plasma CVD apparatus of FIG. 2 includes a coil 10A surrounding the reaction chamber 10 from outside, wherein the coil 10A is energized by a source power of 400 kHz supplied from another RF source (high-frequency power source) 5. It should be noted that the RF power supplied to the coil 10A squeezes the plasma formed inside the reaction chamber 10 to a density of $10^9$ $cm^{-3}$ or more, typically a density of $10^{11}$–$10^{13}$ $cm^{-3}$.

Figure 2:
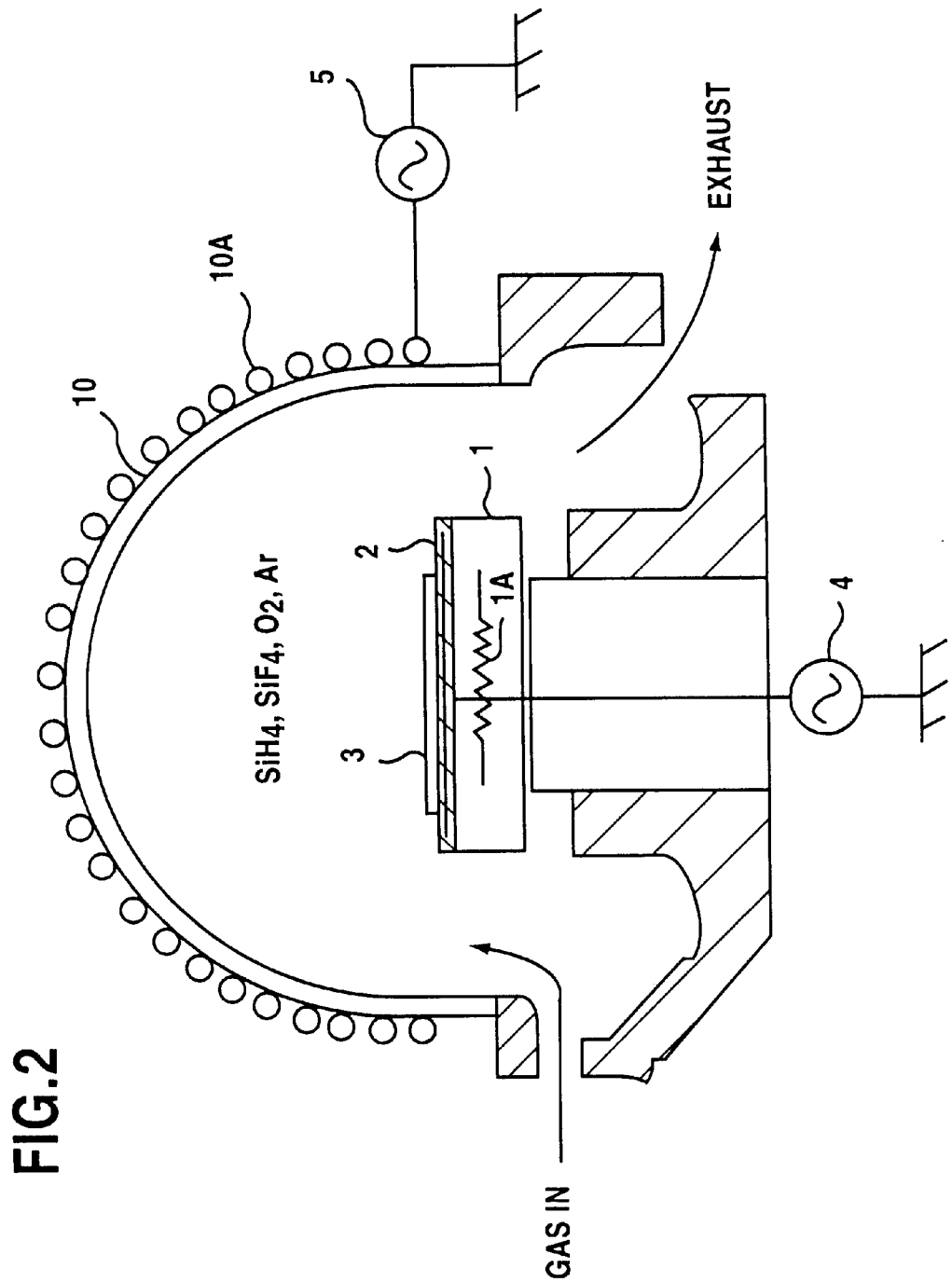
FIG. 2 is a diagram showing the construction of a high-density plasma CVD apparatus used in the present invention.

In the apparatus of FIG. 2, it should be noted that the stage 1A carries thereon a heater 1A, and the substrate temperature is controlled as desired during the deposition by energizing the heater 1A. Further, the F content of the deposited film is controlled by controlling a supply rate of $SiF_4$ to the reaction chamber 10.

As is well known in the art of plasma CVD, the substrate bias applied to the substrate 1 in the construction of FIG. 2 causes an etching simultaneously to the deposition of the insulation film. Thereby, the deposited film has a planarized surface as a result of competition of the etching and deposition that occur simultaneously. On the other hand, the film thus deposited under a large high frequency bias condition, while having a dense structure, tends to accumulate a strain therein as a result of severe bombardment by the Ar atoms.

Figure 3:
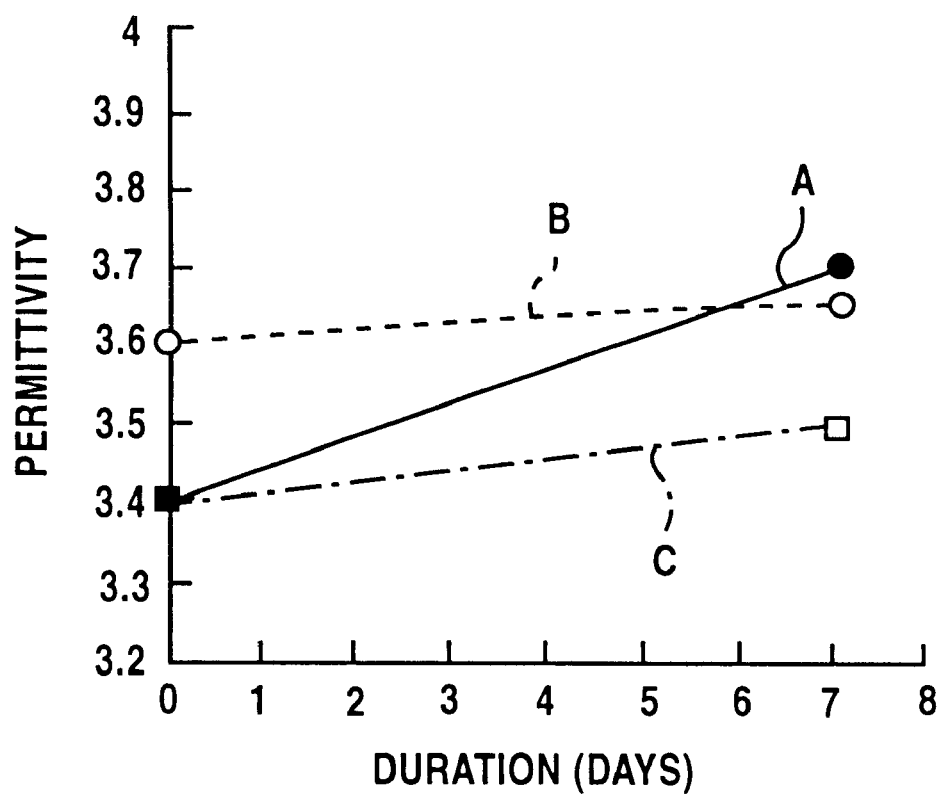
FIG. 3 is a diagram showing the principle of the present invention.

FIG. 3 shows the time-dependent change of the permittivity of the F-containing $SiO_2$ film thus deposited on the Si substrate 3 by means of the plasma CVD apparatus of FIG. 2 wherein the result of FIG. 3 is for the case in which the substrate is left in the air for various durations after the formation of the F-containing $SiO_2$ film.

Referring to FIG. 3, a continuous line A represents the permittivity of the $SiO_2$ film thus deposited under a substrate bias of 1200 W for the case in which the F-concentration in the film is set to about 12 atomic %. On the other hand, a broken line B represents the permittivity of the $SiO_2$ film deposited under the same substrate bias of 1200 W for the case in which the F-concentration in the film is set to 7–8 atomic %.

Referring to FIG. 3, it should be noted that the permittivity of the $SiO_2$ film decreases from about 3.6 represented by the line B to about 3.4 represented by the line A as a result of increase of the F content. Thus, the result of FIG. 3 confirms the known tendency that the permittivity of an $SiO_2$ film is reduced by introducing F into the film.

On the other hand, FIG. 3 further indicates that the permittivity of the F-containing $SiO_2$ film increases with time as indicated by the continuous line A. After being left in the air for 1 week, the permittivity of the $SiO_2$ film that contains F with 12 atomic % eventually exceeds the permittivity of the $SiO_2$ film containing F with only 7–8 atomic %. This result indicates that the $SiO_2$ film thus containing a large amount of F accumulates therein substantial strain, and the strain in the film causes the film to absorb the moisture in the air. Such an increase of the permittivity occurs also in the $SiO_2$ film containing F with a reduced amount as indicated by the line B. However, the rate of increase in such a case is much smaller than the rate for the $SiO_2$ film containing a large amount of F.

Further, the inventor of the present invention has discovered, in a series of experiments to deposit a F-containing $SiO_2$ film on a metal interconnection pattern under a high-density plasma condition, that an insulation structure showing a small permittivity and simultaneously a very small time-dependent change of the permittivity, as indicated by a one-dotted line C in FIG. 3, can be obtained, by forming the insulation structure in a three-layer structure According to the discovery of the inventor, such a three-layer structure can be formed by depositing first and third layers of $SiO_2$ containing F under no substrate bias and by depositing a second layer of $SiO_2$ also containing F under a substrate bias. As the first and third F-containing layers are deposited without a substrate bias, the problem of the time-dependent change of the permittivity, caused by hygroscopicity, is suppressed effectively, and the problem of corrosion or coming-off of the metal conductor pattern is successfully eliminated. As the hygroscopicity is thus improved in the first and third layers, it is possible to increase the F content in the first and third layers for minimizing the permittivity thereof.

It should be noted that the first F-containing layer, being deposited under no substantial bias condition as noted above, tends to show a poor step coverage, and the thickness of the first F-containing layer is generally limited below about 100 nm. Thus, the present invention deposits the second F-containing layer on the first F-containing layer under existence of a substrate bias for improved step coverage. For example, it is possible to completely fill the gap between adjacent metal patterns in a structure in which the metal patterns having a height of about 800 nm and an aspect ratio of about 2 is covered by the first F-containing layer with a thickness of about 100 nm, by depositing the second F-containing layer with a thickness of about 700 nm. As the deposition of the second F-containing layer is carried out under a substrate biasing, it is preferable and necessary to reduce the F content of the second layer in order to minimize the hygroscopicity thereof.

The second F-containing layer thus deposited has a planarized surface, and the present invention deposits the foregoing third F-containing layer thereon under no substantial bias. As the second F-containing layer has a planarized surface, it is possible to deposit the third F-containing layer with an arbitrary thickness such as 1000 nm. In the step of the deposition of the third F-containing layer, it is possible to increase the F content therein without deteriorating the anti-hydroscopic performance, similarly to the case of the deposition of the first F-containing layer. Thus, the overall permittivity of the three-layered insulating structure is effectively reduced. The third F-containing layer may be subjected to a CMP process as necessary.

Summarizing the above, the present invention forms an $SiO_2$ film containing F with a high concentration level by carrying out the deposition in a high-density plasma without a substantial substrate bias. The F-containing $SiO_2$ film thus formed has a low permittivity suitable for high speed operation of the device and is resistant to the absorption of moisture in the air. As the foregoing F-containing $SiO_2$ film is formed under no substantial substrate bias, the $SiO_2$ film thus formed tends to show a poor step coverage and also a poor surface planarization when the deposition is made so as to cover a structure such as the interconnection pattern formed on the substrate. Thus, the present invention conducts a further deposition of a second $SiO_2$ film of a low F concentration level further on the foregoing first $SiO_2$ film in a high-density plasma environment while applying a high frequency bias to the substrate, such that the second $SiO_2$ film, having a low hygroscopicity due to the low F content, fills the depressions on the substrate. By covering the planarized structure thus formed further by a third $SiO_2$ film of a high F content and a low permittivity by conducting the deposition in a high-density plasma under no substantial bias condition, it is possible to form an insulation structure having a low permittivity and simultaneously resistant to hygroscopicity.

FIG. 4 is another diagram showing the principle of the present invention.

As explained previously, it is possible to reduce the permittivity of an interlayer insulation film by incorporating F into the interlayer insulation film. However, such a doping of F tends to cause a problem in that excessive F atoms in the film react with Si in the film and cause a decomposition of the film by producing $SiF_4$. Such a decomposition appears particularly conspicuous in the part of the interlayer film filling a pair of adjacent line patterns. When this occurs, the step coverage of the pattern is deteriorated inevitably.

In contrast, the present invention adds a material containing H (hydrogen) such as $SiH_4$ to the source gas. Such H-containing material releases H radicals at the time of decomposition, and the H radicals thus released react immediately with F radicals inside the deposited interlayer insulation film or in the vicinity of the film to form HF molecules. The HF molecules thus formed are removed from the deposited film efficiently.

FIG. 4 shows the change of the step coverage of the insulation film caused by the addition of H to the gaseous CVD source, wherein it should be noted that the step coverage is defined as $b/a \times 100$ (%) wherein a stands for the film thickness on the top surface of the pattern while b stands for the film thickness on the side wall of the pattern. As noted already, the incorporation of H is made by adding $SiH_4$ to the source material of $SiF_4$. The deposition of the interlayer insulation film is achieved by the high-density plasma CVD process similarly as before.

As will be understood from FIG. 4, the step coverage is 0% when the addition of $SiH_4$, and hence the addition of H, is not made. In this case, no substantial deposition occurs on the side wall of the patterns forming the line-and-space pattern. On the other hand, the step coverage is improved to about 10% by adding the $SiH_4$ source to the $SiF_4$ source with a proportion of about 10%. When the side wall is thus covered by an interlayer insulation film, it becomes possible to deposit a further interlayer insulation film thereon such that the interlayer insulation film covers or buries the line-and-space pattern.

On the other hand, the deposition of such an interlayer insulation film added with H tends to cause the problem of increased hygroscopicity due to the hydrogen atoms contained in the film. Thus, the present invention deposits a second interlayer insulation film on the first interlayer insulation film thus deposited by a similar high-density plasma CVD process, without adding H. As the second interlayer insulation film is not formed in direct contact with the line-and-space pattern, which is already covered by the first interlayer insulation film, no problem of step coverage occurs even when the second interlayer insulation film is deposited without incorporation of H. Thereby, the overall interlayer insulation structure thus formed shows a planarized surface. As the first and second interlayer insulation films are both doped with F, the interlayer insulation structure as a whole shows a very low permittivity.

FIG. 5 shows the relationship between the permittivity and the proportion of the added $SiH_4$ for the first interlayer insulation film in which the addition of H is made.

Referring to FIG. 5, it will be noted that the permittivity increases generally linearly with the incorporation of $SiH_4$. Thus, in order to avoid the unwanted increase of hygroscopicity and further to avoid the increase of permittivity of the interlayer insulation film, it is desired to limit the proportion of added $SiH_4$, and hence the proportion of added H, to be about 30% or less.

Further, the present invention proposes a deposition of a low permittivity SOG film, when conducting a deposition of an interlayer insulation film by way of a high-density plasma CVD process, as a first layer film, such that the SOG film buries the line-and-space pattern. Thereby, a F-doped $SiO_2$ film is deposited on such an SOG film by the high-density plasma CVD process as a second layer film, without applying a substrate biasing. In the interlayer insulation structure thus obtained, a very low permittivity is realized as a whole, as both of the SOG film and the F-doped $SiO_2$ film thereon are characterized by low permittivity. Further, such a structure has an advantageous feature in that the SOG film has an excellent planarized surface. Thus, it is possible to form the F-doped $SiO_2$ film thereon without a substrate bias. Thereby, the F-doped $SiO_2$ film thus obtained shows a very low hygroscopicity in addition to the low permittivity. See the line C of FIG. 3.

Further, as noted already, such a construction of the interlayer insulation structure successfully compensates for the tensile stress field created by the SOG film, by the compressive stress field created by the F-doped $SiO_2$ film. Thereby, the warp of the substrate is minimized or canceled out.

[First Embodiment]

Hereinafter, a first embodiment of the present invention will be described with reference to FIGS. 6A–6D, wherein those parts described previously are designated by the same reference numerals and the description thereof will be omitted.

Figure 6A:
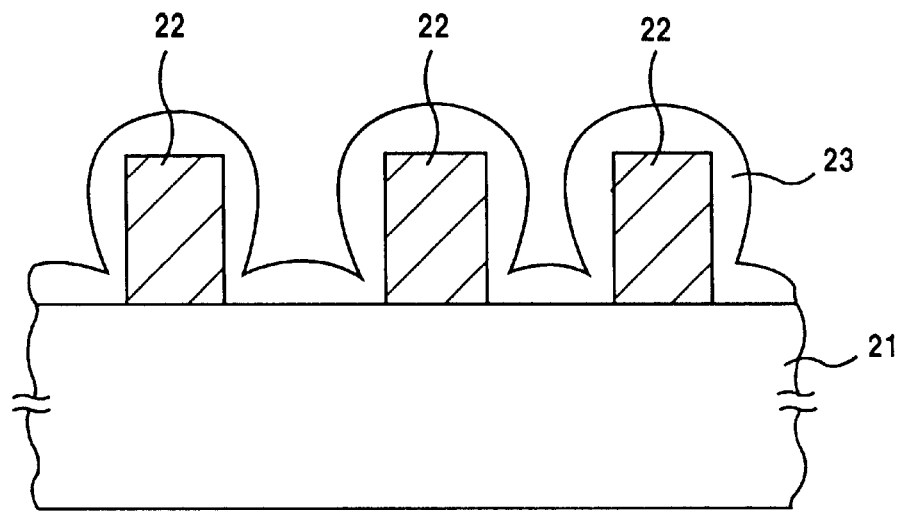
FIGS. 6A–6D are diagrams showing a fabrication process of a semiconductor device according to a first embodiment of the present invention.

Referring to FIG. 6A, a Si substrate 21 carrying thereon an interconnection pattern 22 of Cu or an Al-alloy is held on the stage 1 of the ICP-CVD apparatus of FIG. 2 by means of the electrostatic chucking mechanism 2, and an Ar gas is introduced into the reaction chamber 10 as a plasma gas. The substrate 21 is then heated to a temperature of 300° C. or more, preferably about 400° C., and the reaction chamber 10 is evacuated to a pressure of about 0.8 Pa or less. By energizing the coil 10A by means of the high frequency power source 5 with a power of 4.5 kW, a high-density plasma is formed in the reaction chamber 10 with a plasma density exceeding $10^9$ $cm^{-3}$.

Further, $SiH_4$ and $O_2$ are introduced into the reaction chamber 10 as the source gases of Si and O, together with $SiF_4$ which is used as a dopant gas. Thereby, a F-containing $SiO_2$ film 23 is formed on the interconnection pattern 22 in conformity with a cross-sectional shape of the pattern 22, with a thickness not exceeding 100 nm. The deposition of the $SiO_2$ film 23 is conducted without energizing the high frequency power source 4 and hence without applying a high frequency substrate bias. As the deposition of the $SiO_2$ film 23 is thus conducted without energizing the high frequency power source 4, the step coverage of the $SiO_2$ film 23 over the interconnection pattern 22 becomes inevitably poor. Further, the $SiO_2$ film 23 shows a poor surface planarization. For example, the thickness of the $SiO_2$ film 23 changes between the top surface and the side wall of the interconnection pattern 22. At the top surface, the $SiO_2$ film 23 may have a thickness of about 100 nm, while the same $SiO_2$ film 23 may have the thickness of only about 40 nm at the side wall of the pattern 22.

When depositing the $SiO_2$ film 23, the foregoing source gases and the dopant gas are supplied typically with respective flow rates of 20 cc/min, 200 cc/min and 80 cc/min for $SiH_4$, $O_2$ and $SiF_4$, and the $SiO_2$ film 23 thus formed contains F atoms with a concentration level of about 12 atomic %. On the other hand, the $SiO_2$ film 23 thus formed under no substantial substrate bias, contains little Ar, typically below the detection limit. Thus, the $SiO_2$ film 23 shows a characteristically low permittivity of about 3.4 and a very small time-dependent change of the permittivity as indicated by the line C of FIG. 3.

As explained previously, the $SiO_2$ film 23 covering the interconnection pattern 22 shows a poor planarization. Thus, the present embodiment forms another $SiO_2$ film 24 on the structure of FIG. 6A in the step of FIG. 6B by supplying the foregoing source gases into the reaction chamber 10 under the state that the high frequency power source 4 of FIG. 2 is energized, such that the $SiO_2$ film 24 has a thickness of about 800 nm, for example. The high frequency substrate bias is typically set to about 1200 W, and the film 24 shows an excellent step coverage and excellent planarization as a result of a competition of deposition and etching that occurs in a deposition process carried out under the existence of a high frequency bias.

It should be noted that the $SiO_2$ film 24 tends to show an increased hygroscopicity when the F content therein is high, as indicated by the line A of FIG. 3. Thus, in the present embodiment, the supply rate of $SiF_4$ is reduced to about 70 cc/min such that the F content in the film 24 is reduced to about 7–8 atomic %. Thereby, the problem of instability of the film 24 in the air is successfully eliminated, and the film 24 shows a time-dependent change of the permittivity as indicated by the broken line B in FIG. 3.

Figure 6B:
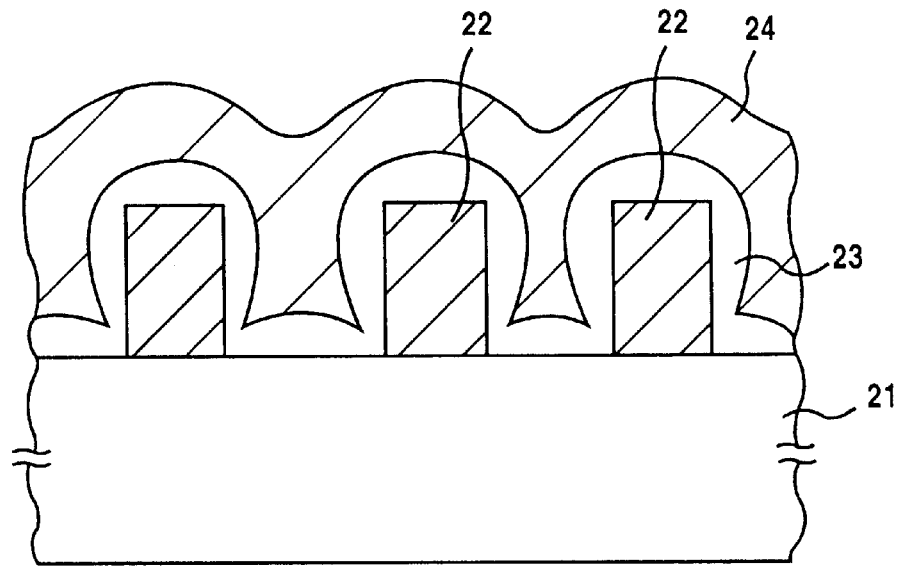
Figure 6C:
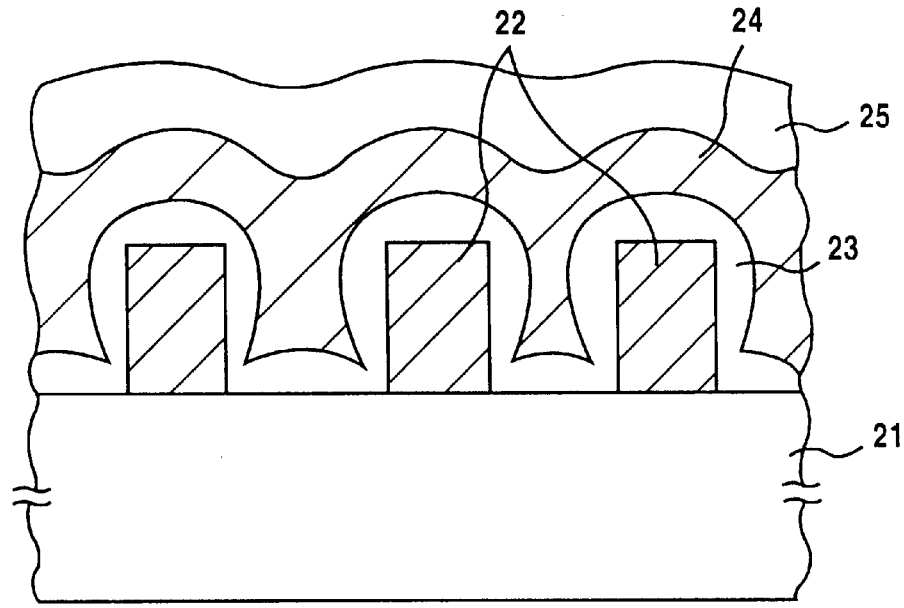

After the structure of FIG. 6B is formed, the present embodiment forms a F-containing $SiO_2$ film 25 of low permittivity on the structure of FIG. 6B with a thickness of about 1.2 $\mu$m as indicated in FIG. 6C, in a state that the high frequency power source 4 is disconnected from the substrate or in a state that the output power of the high-frequency power source 4 is set substantially to zero. Thereby, the supply of the source gases is carried out similarly to the case in which the $SiO_2$ film 23 is formed. Thus, the supply rate of $SiF_4$ is set to 80 cc/min, the supply rate of $O_2$ is set to 200 cc/min and the supply rate of $SiH_4$ is set to 20 cc/min.

The $SiO_2$ film 25 thus formed contains F with a high concentration level of about 12 atomic %. Thus, the film 25 shows a low permittivity of typically 3.4. As the film 25 is formed under existence of no substantial substrate bias, the permittivity of the film 25 changes little with time as indicated by the line C of FIG. 3.

Figure 6D:
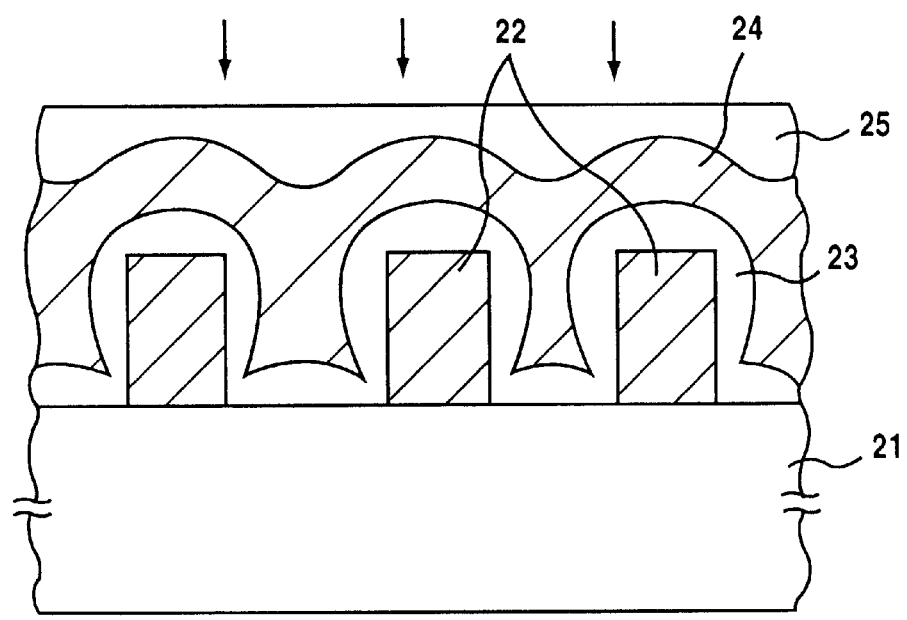

Next, in the step of FIG. 6D, the $SiO_2$ film 25 is subjected to a CMP process for a surface planarization. Thus, by repeating the processes of FIGS. 6A–6D on the planarized structure thus obtained, it is possible to form a multilayer interconnection structure.

In the structure of FIG. 6D, it should be noted that each of the $SiO_2$ films 23, 24 and 25 thus formed is stable against hygroscopy, and the time-dependent change of the permittivity is minimized for these films. On the other hand, the F content and the Ar content change in the $SiO_2$ films 23, 24 and 25 as noted already, while such a change in the F or Ar content causes a change of etching rate in the $SiO_2$ films 23–25. For example, an $SiO_2$ film shows an etching rate of 60 nm/min against a HF solution of 1% concentration level when the film is deposited under a substrate bias of 1200 W. On the other hand, the $SiO_2$ film shows an etching rate of 20 nm/min against the same HF solution when $SiO_2$ film is deposited without a substrate bias. It is believed that the foregoing difference reflects the fact that the film deposited under the substrate bias incorporates therein Ar atoms (typically about 2 atomic %), while the Ar atoms thus incorporated in the film increases the etching rate of the film as a result of distortion caused in the film by the Ar atoms.

In the process of FIG. 6B, it is also possible to incorporate F atoms with a high concentration level such as 12 atomic % into the $SiO_2$ film 24, by supplying SiF with the same rate as in the case of depositing the film 23 or 25. In this case, the film 24 shows a deteriorated hygroscopicity represented in FIG. 3 by the line A. However, the problem of hygroscopicity can be minimized by providing stable SiO$_2$ films above and below the film 24 in the form of the films 23 and 25. The SiO$_2$ film 24 thus formed shows a low permittivity of about 3.4 as indicated in FIG. 3. In this case, too, the composite insulation film formed of the films 23–25 shows a very low permittivity.

In the embodiment described heretofore, it is assumed that the films 23–25 are formed of SiO$_2$. However, the present invention is by no means limited to such a particular composition but is applicable also to an amorphous substance or glass that includes an Si—O bond in the structure thereof such as PSG or BPSG.

Further, it should be noted that the gases supplied to the reaction chamber 10 of the plasma CVD apparatus as the source gas or dopant gas are not limited to the foregoing gases, but it is also possible to use any of Si$_2$H$_6$, SiCl$_4$ or SiH$_2$Cl$_2$ for the source of Si. Further, it is possible to use various O-containing gases such as N$_2$O in place of O$_2$. Further, various F-containing gases such as Si$_2$H$_2$F$_2$ can be used for the dopant gas of F.

It should be noted further that the plasma gas is not limited to Ar as described heretofore, but it is also possible to use Xe. In this case, the SiO$_2$ film 24 shows an increased Xe-content as compared with the layer 23 or 25.

In any of the foregoing processes, it should be noted that the high frequency bias produced by the power source 4 is switched between zero and 1200 W. However, a similar effect is achieved also when the output power of the power source 4 is set to within about 100 W in place of setting the output power to zero exactly. Further, it is possible to change the power of the high frequency bias within the range of 90–150 W when depositing the film 24 under the substrate bias condition.

As explained already, the substrate temperature in the steps of FIGS. 6A–6C is not limited to 400° C. A similar F-containing SiO$_2$ film is obtained by setting the substrate temperature to 300° C. or more.

[Second Embodiment]

Figure 7:
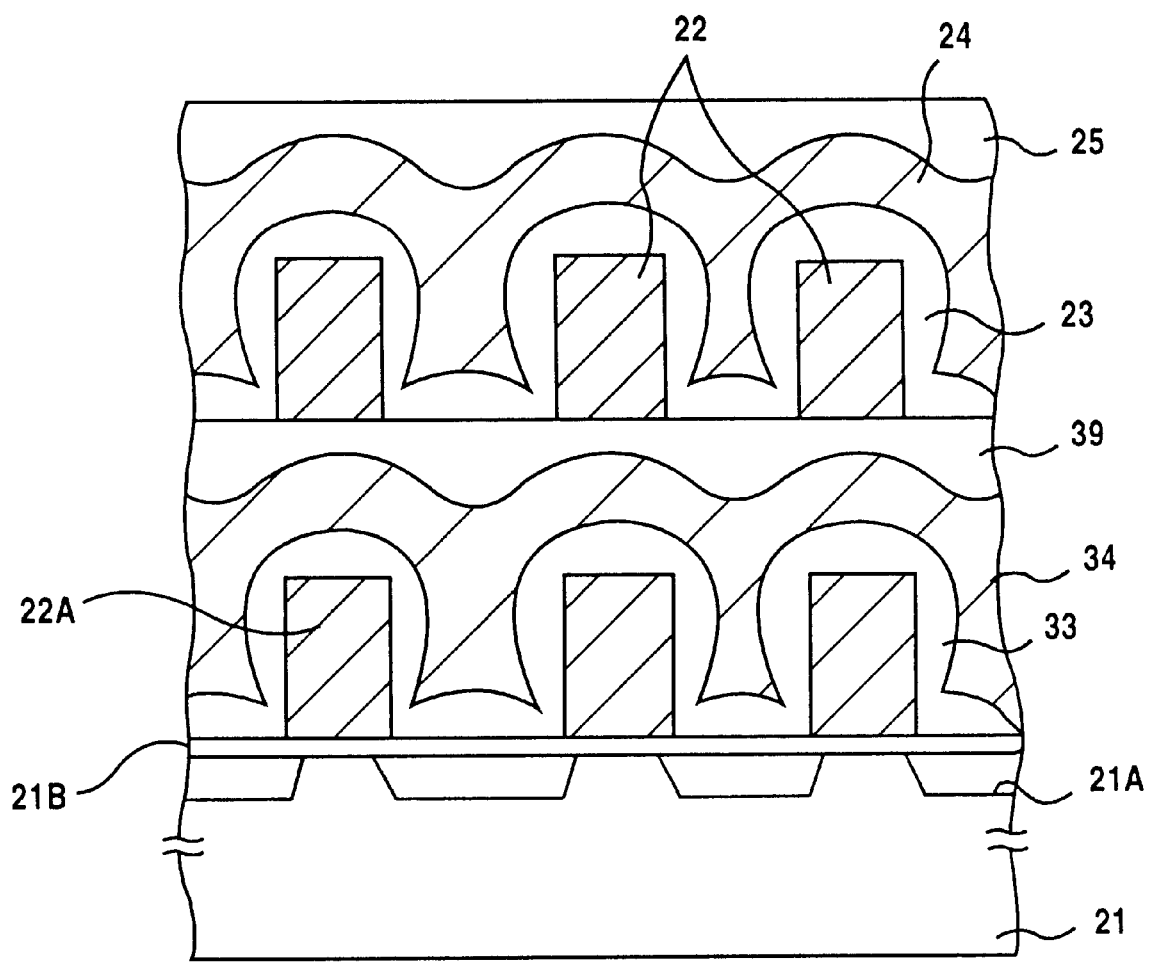
FIG. 7 is a diagram showing the construction of a semiconductor device that includes a multilayer interconnection structure according to a second embodiment of the present invention.

Next, a second embodiment of the present invention will be described with reference to FIG. 7 showing an example of a MOS integrated circuit that carries a multilayer interconnection structure.

Referring to FIG. 7, the Si substrate 21 carries a thermal oxide film 21B on the surface thereof, and a polysilicon or W gate pattern 22A is provided on the thermal oxide film 21B. Further, the substrate 21 is formed with diffusion regions 21A at both sides of the gate pattern 22A.

The gate pattern 22A is covered by a F-containing SiO$_2$ film 33 corresponding to the film 23 described previously, wherein the SiO$_2$ film 33 is deposited without a substantial substrate bias and covers the gate pattern 22A in conformity with the cross-sectional shape of the gate pattern 22A. Similarly to the film 23, the SiO$_2$ film 33 contains F atoms with a concentration level of about 12 atomic % and has a small permittivity of about 3.4. As the deposition of the film 33 is made without a substrate bias, the film 33 contains inert gas atoms such as Ar or Xe well below the detection limit. Further, associated with the very low inert gas content, the SiO$_2$ film 33 shows a small etching rate of 20 nm/min for example, using an HF etchant with a 1% concentration level.

On the SiO$_2$ film 33, another SiO$_2$ film 34 is formed under existence of a substrate bias, typically of 1200 W. Thereby, the deposition of the SiO$_2$ film 34 is made with a reduced F content of 7–8 atomic %, similarly to the case of the film 24. As the film 34 is formed under the substrate bias, the film 34 fills the gap between the gate patterns 22A, and the film 34 shows a generally planarized surface. The SiO$_2$ film 34 is characterized by an increased concentration level of inert gas atoms such as Ar or Xe, typically with a level of 0.2 atomic %. Associated with the increased concentration level of the inert gas atoms, the SiO$_2$ film 34 shows an increased etching rate of typically 60 nm/min using the HF etchant.

On the SiO$_2$ film 34, a further SiO$_2$ film 35 is formed in correspondence to the SiO$_2$ film 25 by conducting the deposition under absence of the substrate bias. Thereby, the SiO$_2$ film 35 contains F atoms with a concentration level of about 12 atomic % similarly to the film 25, while the film 35 thus formed shows a stability with regard to the permittivity due to the deposition process conducted without a substrate bias.

The SiO$_2$ film 35 is planarized further by a CMP process, and the structure described with reference to FIG. 6D and including the SiO$_2$ films 23–25 covering the interconnection pattern 22, is further provided on the SiO$_2$ film 35.

[Third Embodiment]

Figure 8A:
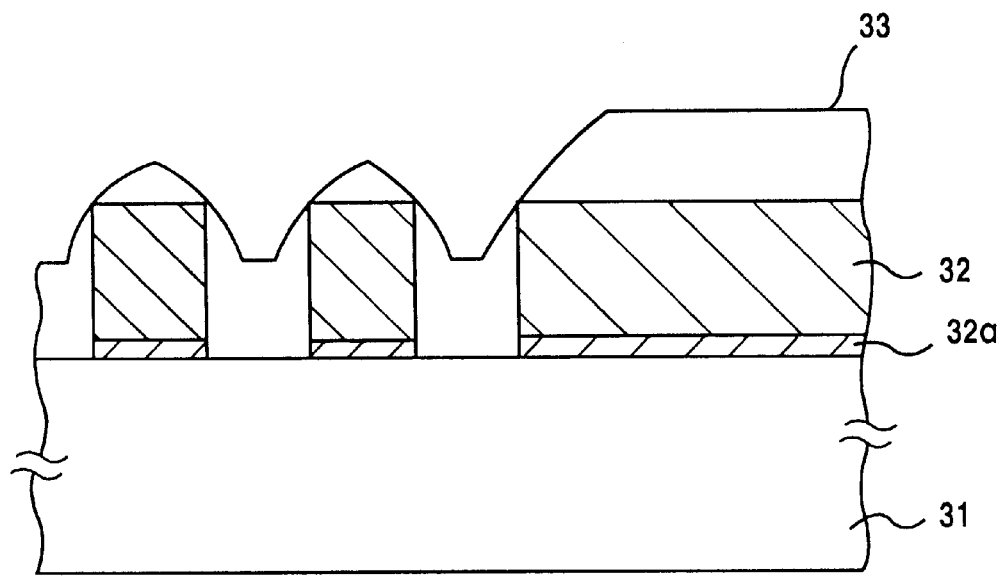
FIGS. 8A and 8B are diagrams showing a fabrication process of a semiconductor device according to a third embodiment of the present invention.
Figure 8B:
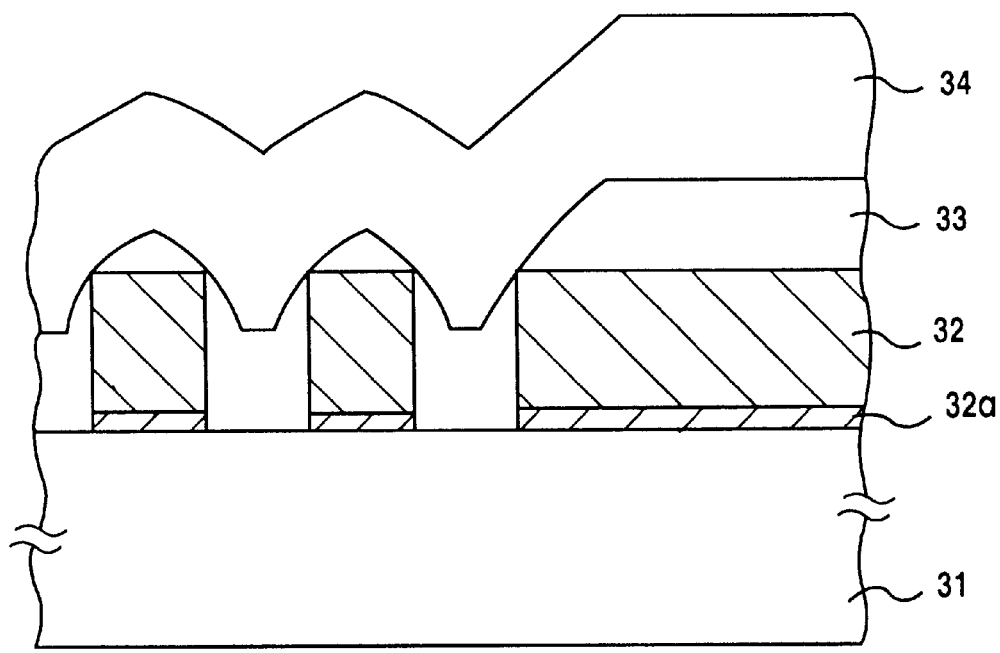

FIGS. 8A and 8B show a fabrication process of a semiconductor device according to a third embodiment of the present invention.

Referring to FIG. 8A, a Si substrate 31 carries a conductor pattern 32 of Al or an Al alloy, and a first interlayer insulation film 33 is deposited by a high-density plasma CVD process conducted in the apparatus of FIG. 2, such that the film 33 buries the conductor pattern 32. The conductor pattern 32 forms a line-and-space pattern and may have a height of 0.8 $\mu$m and an aspect ratio of 2. Further, a glue layer 32a of TiN or the like is interposed between the substrate 31 and the line-and-space pattern 32 as usual.

The deposition of the interlayer insulation film 33 is carried out in an Ar atmosphere while using SiH$_4$, SiF and O$_2$ as the gaseous sources, such that the interlayer insulation film 33 has a thickness of about 300 nm. During the deposition, a high frequency substrate bias of 13.56 MHz is applied with a power of 1200 W. In a typical example, SiF$_4$, SiH$_4$, O$_2$ and Ar are supplied with respective flow rates of 80 cc/min, 20 cc/min, 200 cc/min and 440 cc/min, and the film 33 thus formed typically contains F with a concentration of 8–12 atomic %.

In the deposition of the interlayer insulation film 33 conducted as such under the existence of SiH$_4$, the excessive F radicals in the vicinities of the film 33 are efficiently removed in the form of HF, and the step coverage of the film 33 over the line-and-space pattern 32 is substantially improved. In other words, the gap between adjacent line patterns forming the line-and-space pattern 32 is filled by the interlayer insulation film 33 effectively. In the foregoing setting of the supply rate of the gaseous sources to the CVD apparatus, it should be noted that the proportion of SiH$_4$ is about 20% in volume.

Generally, the volumetric proportion of SiH$_4$ is set in a range between 10–50%, preferably in a range between 10–30% for achieving a satisfactory step coverage and at the same time a reduced hygroscopicity. Further, by setting the proportion of SiH$_4$ as such, it is possible to suppress the permittivity. See FIG. 5. The F-doped SiO$_2$ film thus formed generally contains H with a concentration of 1–3 atomic %.

In the present embodiment, a further F-doped SiO$_2$ film is deposited on the structure of FIG. 8A as a second interlayer insulation film 34, typically with a thickness of about 1600 nm. See FIG. 8B. The interlayer insulation film 34 is deposited by a high-density plasma CVD process similarly to the case of depositing the interlayer insulation film 33, except that the addition of an H-containing compound such as $SiH_4$ is not made. Thus, $SiF_4$, $O_2$ and Ar alone are supplied during the high-density plasma CVD process of the insulation film 34, with respective flow rates of 80 cc/min, 200 cc/min and 440 cc/min. During the high-density plasma CVD apparatus of the film 34, a substrate bias of 1200 W is applied similarly to the case of depositing the first interlayer insulation film 33.

It should be noted that the interlayer insulation film 34 also contains F with a high concentration level of 8–12 atomic % similarly to the film 33. Thus, the film 34 has a low permittivity. As the deposition of the interlayer insulation film 34 is not made directly upon the line-and-space pattern 32, the problem of step coverage does not occur.

In the deposition of the films 33 and 34, it is possible to use materials other than $SiF_4$ for the source of Si and F. For example, it is possible to use materials such as $Si_2F_6$, $SiH_2F_2$, $C_2F_6$ or $CF_4$, for this purpose. Similarly, it is possible to use materials other than $SiH_4$ as the source of hydrogen. For example it is possible to use $H_2$, $Si_2H_6$, $SiH_2Cl_2$, and the like, for this purpose. Particularly, the use of $SiH_2F_2$ is advantageous, as this material acts simultaneously as the source of Si and F and further the source of hydrogen. Further, it is possible to use various oxygen containing materials such as $N_2O$ for the source of oxygen, in addition to $O_2$.

It should be noted that the structure of FIG. 8B may be further subjected to a CMP process similarly to FIG. 6D for planarization.

[Fourth Embodiment]

Figure 9A:
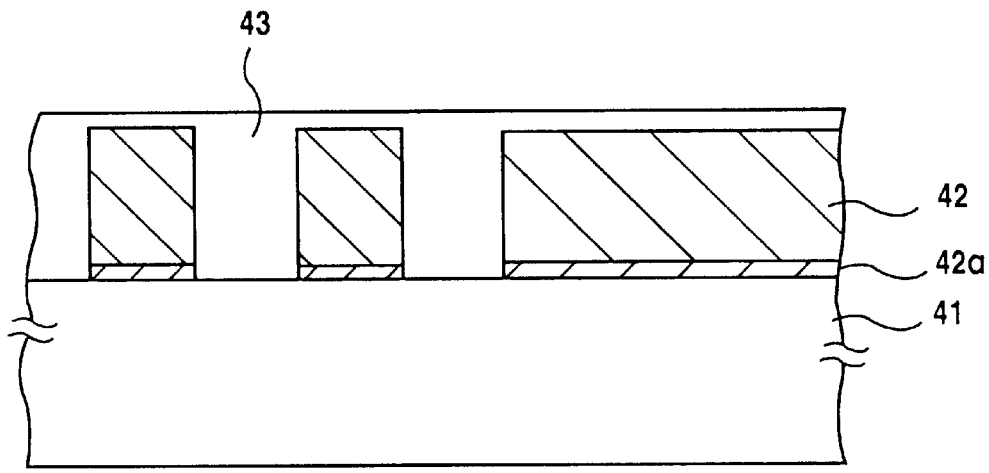
FIGS. 9A and 9B are diagrams showing a fabrication process of a semiconductor device according to a fourth embodiment of the present invention.
Figure 9B:
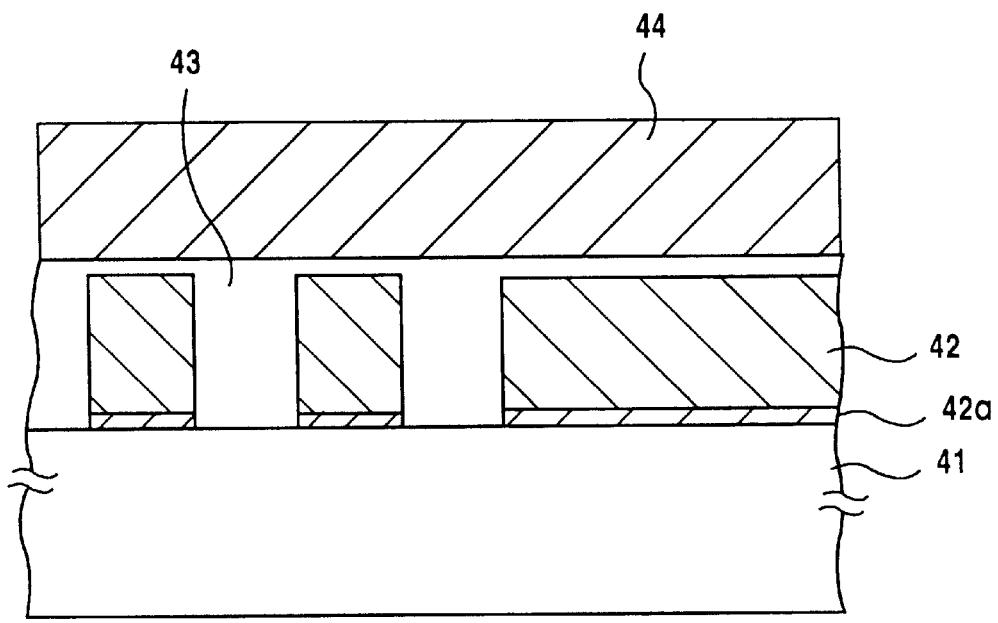

FIGS. 9A and 9B show a fabrication process of a semiconductor device according to a fourth embodiment of the present invention.

Referring to FIG. 9A, a Si substrate 41 carries thereon a conductor pattern 42 of Al or an Al-alloy, and a first interlayer insulation film 43 of SOG is deposited thereon by a spin-coating process. The conductor pattern 42 forms a line-and-space pattern having a height of 0.8 $\mu$m and an aspect ratio of about 2. Further, a glue layer 42a of TiN is interposed between the Si substrate 41 and the conductor pattern 42 as usual.

In the structure of FIG. 9A, the interlayer insulation film 43 of SOG fills the gap between adjacent patterns of the line-and-space pattern 42 and is characterized by a planarized surface. Further, the interlayer insulation film 43 shows a characteristically very low permittivity of 2.0–3.0. The SOG forming the interlayer insulation film 43 may be one based on polytetrafluoroethylene known as Teflon.

As explained previously, an SOG film develops a tensile stress field on a substrate, and there is a substantial risk that the tensile stress field thus created causes the substrate to warp such that the substrate has a concaved top surface.

Thus, in order to avoid such a warp of the substrate 41, the present invention employs a step of FIG. 9B in which a second interlayer insulation film 44 of F-doped $SiO_2$ is deposited on the SOG film 43 by a high-density plasma CVD process. The second interlayer insulation film 44 may have a thickness of about 100 nm and creates a compressive stress field that cancels out the tensile stress field created by the SOG film 43. Thereby, the problem of warp of the substrate 41, caused by the SOG film 43, is successfully eliminated. The interlayer insulation film 44 typically contains F with a concentration level of 8–12 atomic %, similarly as before.

The deposition of the interlayer insulation film 44 may be conducted for example by supplying $SiF_4$, $O_2$ and Ar with respective flow rates of 80 cc/min, 160 cc/min and 440 cc/min and by setting the substrate bias to 0 W. As explained already with reference to the line C of FIG. 3, such a F-doped $SiO_2$ film deposited without a substrate bias shows a low permittivity and low hygroscopicity. While the deposition without a substrate biasing is disadvantageous from a viewpoint of step coverage, the deposition of the interlayer insulation film 44 in the structure of FIG. 9B does not cause a problem of step coverage at all, as the underlying interlayer insulation film 43 is an SOG film and inherently has an excellent planarized top surface.

In the present embodiment, too, it is possible to use various F-containing compounds such as $Si_2F_6$ in addition to $SiF_4$ for the source of Si and F.

Further, the present invention is not limited to the embodiments described heretofore, but various variations and modifications may be made without departing from the scope of the present invention.

What is claimed is:

1. A semiconductor device, comprising:

a substrate, a structure formed on said substrate, said structure including a projection and a depression; and an insulation film provided so as to bury said structure;

said insulation film comprising:

a first insulation film extending in conformity with a cross-sectional shape of said structure;

a second insulation film provided on said first insulation film so as to fill said depression, said second insulation film having a substantially planarized surface; and a third insulation film provided on said second insulation film;

said first insulation film containing an inert gas with a concentration;

said second insulation film containing said inert gas with a second, higher concentration;

said third insulation film containing said inert gas with a third concentration lower than said second concentration.

2. The semiconductor device as claimed in claim 1, in which each of said first through third insulation films contains an Si—O bond in a structure thereof.

3. The semiconductor device as claimed in claim 1, wherein said first through third insulation films are formed of a material selected from a group of $SiO_2$, a phosphosilicate glass and a borophosphosilicate glass.

4. The semiconductor device as claimed in claim 1, wherein said first insulation film contains fluorine with a first fluorine concentration, said second insulation film contains fluorine with a second, smaller fluorine concentration, and said third insulation film contains fluorine with a third fluorine concentration lower than said second fluorine concentration.

5. The semiconductor device as claimed in claim 1, wherein said first insulation film shows a first etching rate for an etchant, said second insulation film shows a second, larger etching rate for said etchant, said third insulation film shows a third etching rate smaller than said second etching rate for said etchant.

6. A semiconductor devices comprising:

a substrate;

a pattern provided on said substrate; and an interlayer insulation film provided on said substrate so as to bury said pattern;

said interlayer insulation film comprising a first film burying said pattern and a second film provided on said first film;

each of said first and second films being formed of $SiO_2$ doped with fluorine;

said first film further containing hydrogen with a concentration level higher than in said second film.

7. The semiconductor device as claimed in claim 6, wherein said first film contains hydrogen with a concentration level of 1–3 atomic %, and wherein said second film is substantially free from hydrogen.

8. A semiconductor device, comprising:

a substrate;

a pattern formed on said substrate; and an interlayer insulation film provided on said substrate so as to bury said pattern;

said interlayer insulation film comprising:

a first film of a spin-on-glass provided on said substrate so as to bury said pattern, said first film having a planarized surface; and a second film of $SiO_2$ doped with fluorine and provided on said first film, said second film containing an inert gas.

* * * * *